United States Patent
Ohta et al.

(10) Patent No.: US 8,723,253 B2
(45) Date of Patent: May 13, 2014

(54) SEMICONDUCTOR DEVICE AND METHOD FOR MANUFACTURING SAME

(75) Inventors: Tsuyoshi Ohta, Kanagawa-ken (JP); Masatoshi Arai, Tokyo (JP); Miwako Suzuki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/239,101

(22) Filed: Sep. 21, 2011

(65) Prior Publication Data

US 2012/0241854 A1 Sep. 27, 2012

(30) Foreign Application Priority Data

Mar. 23, 2011 (JP) ................................. 2011-064854

(51) Int. Cl.
*H01L 29/66* (2006.01)

(52) U.S. Cl.
USPC ....................... 257/331; 257/E21.41; 438/270

(58) Field of Classification Search
USPC ...................... 257/331, E21.41; 438/270, 585
See application file for complete search history.

(56) References Cited

U.S. PATENT DOCUMENTS

| | | | | |
|---|---|---|---|---|
| 5,891,807 A | * | 4/1999 | Muller et al. | 438/713 |
| 8,101,500 B2 | * | 1/2012 | Wang et al. | 438/458 |
| 2001/0028083 A1 | * | 10/2001 | Onishi et al. | 257/328 |
| 2011/0136310 A1 | * | 6/2011 | Grivna | 438/270 |
| 2011/0169103 A1 | * | 7/2011 | Darwish et al. | 257/409 |

FOREIGN PATENT DOCUMENTS

| | | |
|---|---|---|
| JP | 11-195784 | 7/1999 |
| JP | 2001-230414 | 8/2001 |
| JP | 2008-060138 | 3/2008 |
| WO | 2005/065385 A2 | 7/2005 |
| WO | 2006/127914 A2 | 11/2006 |
| WO | 2009/046210 A1 | 4/2009 |

OTHER PUBLICATIONS

Japanese Office Action dated Aug. 14, 2013, filed in Japanese counterpart Application No. 2011-064854, 8 pages.

* cited by examiner

*Primary Examiner* — Yu-Hsi D Sun
*Assistant Examiner* — Christina Sylvia
(74) *Attorney, Agent, or Firm* — Patterson & Sheridan, LLP

(57) ABSTRACT

According to one embodiment, the semiconductor device includes a first semiconductor layer. The semiconductor device includes a plurality of base regions, the base regions are provided on a surface of the first semiconductor layer. The semiconductor device includes a source region selectively provided on each of surfaces of the base regions. The semiconductor device includes a gate electrode provided via a gate insulating film in each of a pair of trenches, each of the trenches penetrate the base regions from a surface of the source region to the first semiconductor layer. The semiconductor device includes a field plate electrode provided via a field plate insulating film in each of the pair of trenches under the gate electrode. A thickness of a part of the field plate insulating film is greater than a thickness of the gate insulating film.

10 Claims, 15 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2011-064854, filed on Mar. 23, 2011; the entire contents of which are incorporated herein by reference.

FIELD

Embodiments described herein relate generally to a semiconductor device and a method for manufacturing the same.

BACKGROUND

Power MOSFET (Metal Oxide Semiconductor Field Effect Transistor) having an upper and lower electrode structure is a semiconductor device used, for example, for power conversion of home electrical appliances, car motors or the like. Since this kind of the semiconductor device is used for power, it is required to have a high withstand voltage. Additionally, for this kind of device, it is necessary to decrease the resistance (hereafter, ON-state resistance) at ON-operation for lower power consumption.

There is a field plate configuration as a measure to decrease the ON-state resistance. In the field plate configuration, a gate electrode is provided in a trench via a gate insulating film, and a field plate electrode is provided under the gate electrode via a field plate oxidization film. When providing the field plate electrode, there is an advantage in that an impurity concentration in the drift layer of the MOSFET can be increased, and thus the ON-state resistance is reduced. Moreover, in this kind of MOSFET, the depletion of the drift layer can be made with ease by the field plate electrode, and the high withstand voltage is maintained.

However, with the miniaturization of the power MOSFET, trenches tend to have smaller pitches. As the pitches of the trenches become smaller, the base layer sandwiched between the trenches becomes narrower. As a result, it becomes more and more difficult to form the source layer to be provided on the surface of the base layer or a carrier extraction layer to be provided in the base layer. For example, the career extraction layer, for example, excludes holes generated by the avalanche breakdown. The avalanche resistance of the power MOSFET is improved by providing such layer. Therefore, a power MOSFET having low ON-resistance and high tolerance even when the miniaturization of the power MOSFET proceeds is required.

DETAILED DESCRIPTION

Figure 1A:
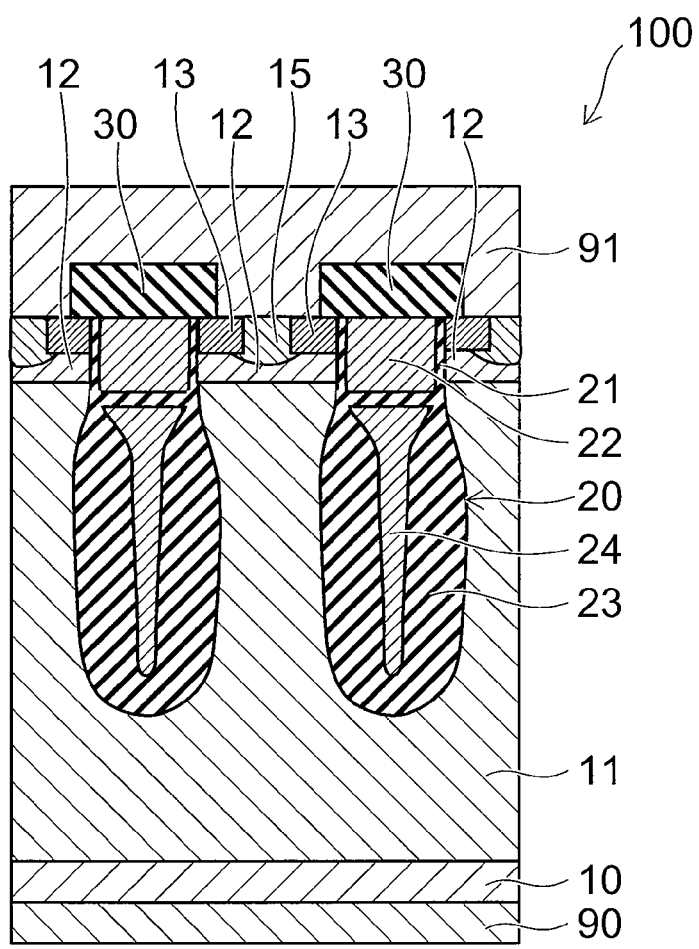
FIGS. 1A and 1B are schematic views of a semiconductor device according to a first embodiment.

In general, according to one embodiment, a semiconductor device is disclosed. The semiconductor device includes a first semiconductor layer of a first conductivity type. The semiconductor device includes a plurality of base regions of a second conductivity type, the base regions are provided on a surface of the first semiconductor layer. The semiconductor device includes a source region of the first conductivity type selectively provided on each of surfaces of the base regions. The semiconductor device includes a gate electrode provided via a gate insulating film in each of a pair of trenches, each of the trenches penetrate the base regions from a surface of the source region to the first semiconductor layer. The semiconductor device includes a field plate electrode provided via a field plate insulating film in each of the pair of trenches under the gate electrode. The semiconductor device includes a first major electrode electrically connected to the first semiconductor layer, and a second major electrode electrically connected to the source region. A thickness of a part of the field plate insulating film is greater than a thickness of the gate insulating film. A width of the first semiconductor layer between the pair of trenches at a position of the part of the field plate insulating film is narrower than a width of each of the base regions between the pair of trenches at a position of the gate insulating film. The source region is not formed directly above an interface between the first semiconductor layer and the part of the field plate insulating film.

Hereinafter, embodiments will be described with reference to the accompanying drawings. In the following embodiments, like components are marked with like reference numerals, description thereof is appropriately omitted.

First Embodiment

Figure 1B:
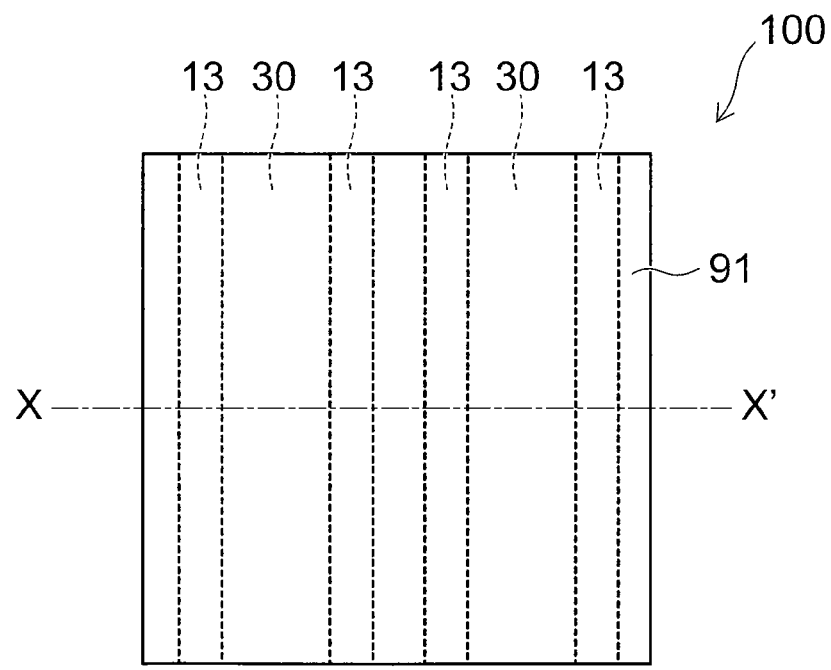

FIGS. 1A and 1B are schematic views of a semiconductor device according to a first embodiment, in which FIG. 1A is a schematic cross-sectional view, and FIG. 1B is a schematic plan view. In FIG. 1A, a cross-sectional view taken along the line X-X' of FIG. 1B is shown.

Figure 2:
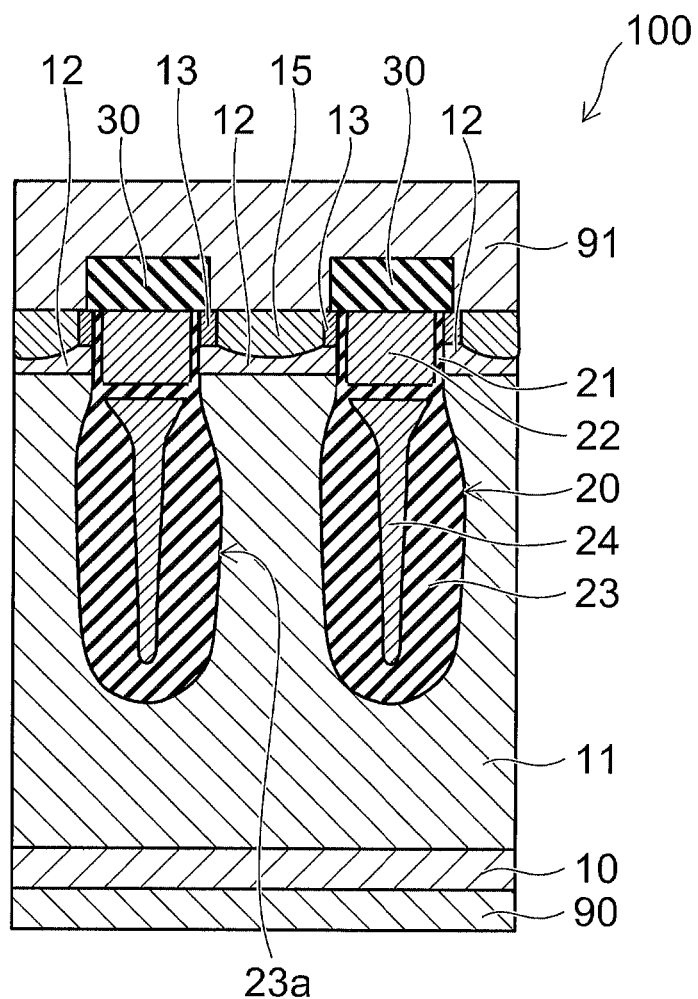
FIG. 2 is a schematic cross-sectional view of the semiconductor device according to the first embodiment.

FIG. 2 is a schematic cross-sectional view of the semiconductor device according to the first embodiment.

A semiconductor device 100 shown in FIG. 1 is a power MOSFET element having an upper and lower electrode structure. In the semiconductor device 100, an n-type drift layer 11 (a first semiconductor layer) is provided on an n$^+$-type drain layer 10. A plurality of p-type base regions 12 are provided on the surface of the drift layer 11. an N$^+$-type source regions 13 is selectively provided on each of the surfaces of the base regions 12.

Furthermore, in the semiconductor device 100, a p$^+$-type contact region 15 (carrier extraction region) is selectively provided on the surfaces of the base regions 12. The contact region 15 is connected to the source region 13. An impurity concentration in the contact region 15 is higher than an impurity concentration in the base regions 12. A distance between a lower end of the contact region 15 and a rear surface of a drift layer 11 (or an upper surface of the drain layer 10) is shorter than a distance between a lower end of the source region 13 and the rear surface of the drift layer 11 (or the upper surface of the drain layer 10).

Moreover, in the semiconductor device 100, each of gate electrodes 22 is provided via the gate insulating film 21 in a pair of trenches 20 which penetrate the base regions 12 from the surface of the source region 13 to reach the drift layer 11. The embodiment is not limited to the semiconductor device provided with only one pair of trenches 20. That is, the embodiment includes semiconductor devices provided with two or more plural trenches 20.

In the pair of trenches 20, field plate electrodes 24 are provided under each of gate electrodes 22 via field plate insulating films 23.

The drift layer 11 can be depleted with ease by providing the field plate electrodes 24 of a trench structure in the drift layer 11. Therefore, the impurity concentration in the drift layer 11 can be made high. As a result, the specific resistance of the drift layer 11 is reduced, which in turn reduces the ON-resistance. An interlayer insulating film 30 is provided on the gate electrode 22, the gate insulating film 21, and the source region 13.

Moreover, in the semiconductor device 100, the thickness of a part 23a of the field plate insulating film 23 is greater than the thickness of the gate insulating film 21. Such part of the field plate insulating film 23 is, for example, the part in contact with the side face of the field plate electrode 24. With this structure, the width of the drift layer 11 between the parts of the field plate insulating film 23 provided in each of the pair of trenches 20 is narrower than the width of the base region 12 between the gate insulating films 21 provided in each of the pair of trenches 20. Here, the "width" is defined to be a distance between respective components of the semiconductor device 100 in the direction the trenches are aligned periodically. In other words, the width of the drift layer 11 between the pair of trenches 20 at a position of the part of the field plate insulating film 23 is narrower than the width of each of the base regions 12 between the pair of trenches 20 at a position of the gate insulating film 21.

Additionally, in the semiconductor device 100, the width of the source region 13 is adjusted appropriately. For example, in FIG. 2, the width of the source region 13 is narrower than the width of the source region 13 illustrated in FIG. 1. That is, the structure in which the source region 13 is not formed directly above the interface between the drift layer 11 and the part of the field plate insulating film 23, which is in contact with the side face of the field plate electrode 24, is included in the embodiment. In this case, the contract region 15 is formed directly above the interface.

Moreover, in the semiconductor device 100, a first major electrode 90, i.e., a drain electrode, is electrically connected to the drift layer 11 via the drain layer 10. A second major electrode 91, i.e., a source electrode, is electrically connected to the source region 13 and the contact region 15. The field plate electrode 24 is, for example, electrically connected to the first major electrode 91 or the gate electrode 22.

A major component of the drain layer 10, the drift layer 11, the base region 12, the source region 13, and the contact region 15 is, for example, silicon (Si). A material of the gate insulating film 21, the field plate insulating film 23 and the interlayer insulating film 30 is, for example, silicon oxide ($SiO_2$). A material of the gate electrode 22 and the field plate electrode 24 is polysilicon containing impurities.

A material of the first major electrode 90 is metal such as copper (Cu) or aluminum (Al) or the like. A material of the second major electrode 91 is metal such as molybdenum (Mo), aluminum (Al), copper (Cu) or the like. In the case where the Schottky barrier diode (hereafter, SBD) to be described later is also provided in the semiconductor device 100, it is desirable that the material of the second major electrode 91 is a metal such as molybdenum (Mo), aluminum (Al) or the like.

Furthermore, in the embodiment, the n-type, the $n^+$-type and the $n^-$-type may be all referred to as the first conductivity type, and the $p^+$-type and the $p^-$-type may be all referred to as the second conductivity type. As impurities of the first conductivity type, for example, phosphorus (P), arsenic (As), and the like are used. As impurities of the second conductivity type, Boron (B) is used.

FIGS. 3A to 6B are schematic cross-sectional views for explaining manufacturing processes of a semiconductor device according to the first embodiment.

Figure 3A:
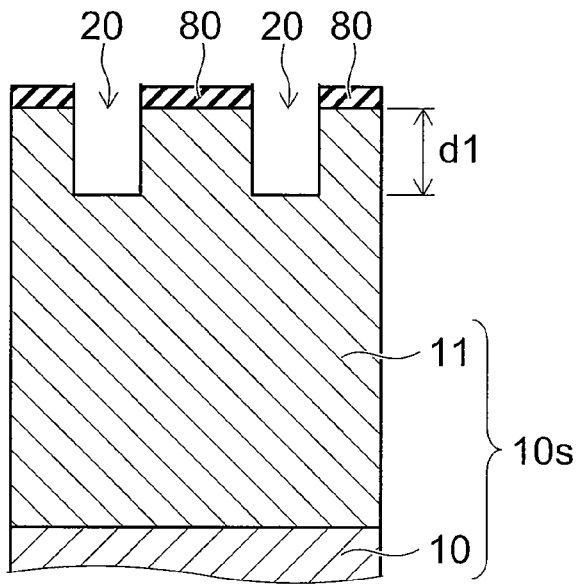
FIGS. 3A to 6B are schematic cross-sectional views for explaining manufacturing processes of a semiconductor device according to the first embodiment.

First, as shown in FIG. 3A, a semiconductor substrate 10s having the drift layer 11 formed on the surface thereof is prepared. The semiconductor substrate 10s includes the drain layer 10 and the drift layer 11 formed on the drain layer 10.

After preparing the semiconductor substrate 10s, a mask component 80 is selectively formed on the surface of the semiconductor substrate 10s. A material of the mask component 80 is, for example, silicon oxide ($SiO_2$). Afterward, etching of the drift layer 11 exposed from the mask component 80 is performed through the use of the Reactive Ion Etching (RIE). As a result, the pair of trenches 20 with a thickness of d1 is selectively formed so as to extend from the surface to the inside of the drift layer 11.

Figure 3B:
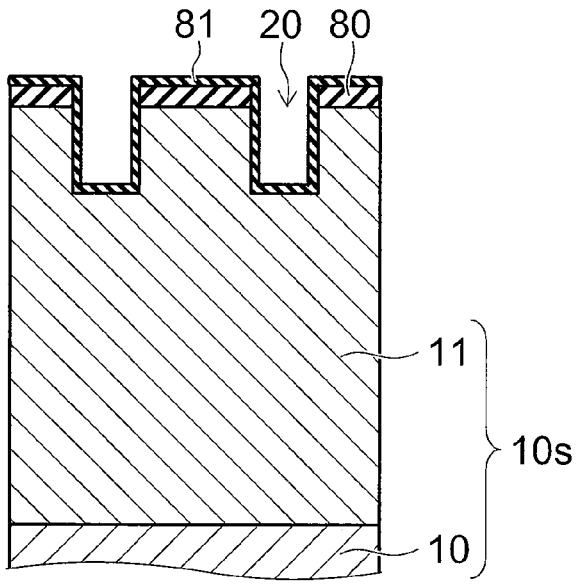

Next, as shown in FIG. 3B, a mask film 81 is formed on an inner side face and a bottom face of each of the pair of trenches 20. The mask film 81 is a film of a single layer made of silicon nitride ($Si_3N_4$) or a film of two layer configuration of silicon nitride ($Si_3N_4$)/silicon oxide ($SiO_2$). The mask film 81 may be formed also on the surface and the side face of the mask component 80 other than the inside of the trenches 20.

Figure 3C:
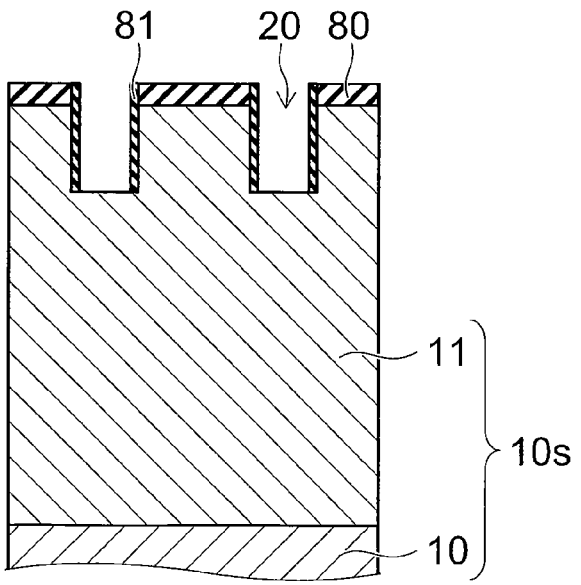

Subsequently, as shown in FIG. 3C, the mask film 81 formed on the bottom face of each of the pair of trenches 20 is removed by RIE, and thus the drift layer 11 is exposed from the bottom face of each of the pair of trenches 20.

Figure 4A:
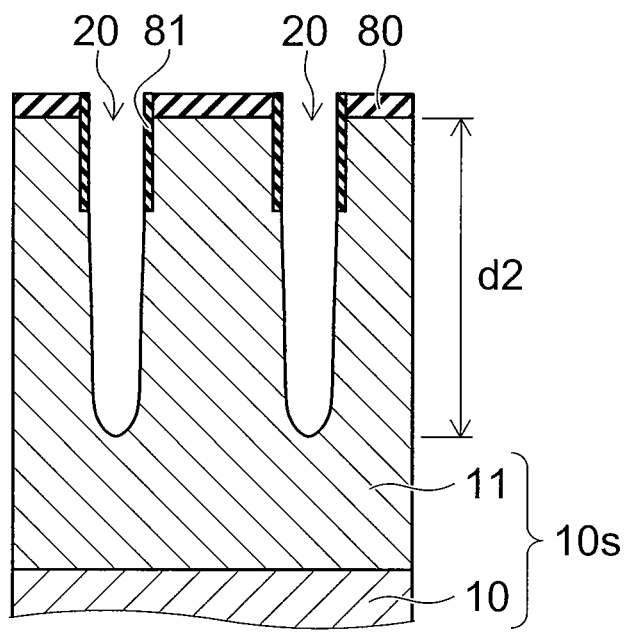

Then, as shown in the FIG. 4A, the drift layer 11 exposed from the bottom face of each of the pair of trenches 20 is removed by RIE. As a result, the trenches 20 having a depth of d2, which is greater than the depth d1, are formed so as to extend from the surface to the inside of the drift layer 11.

Figure 4B:
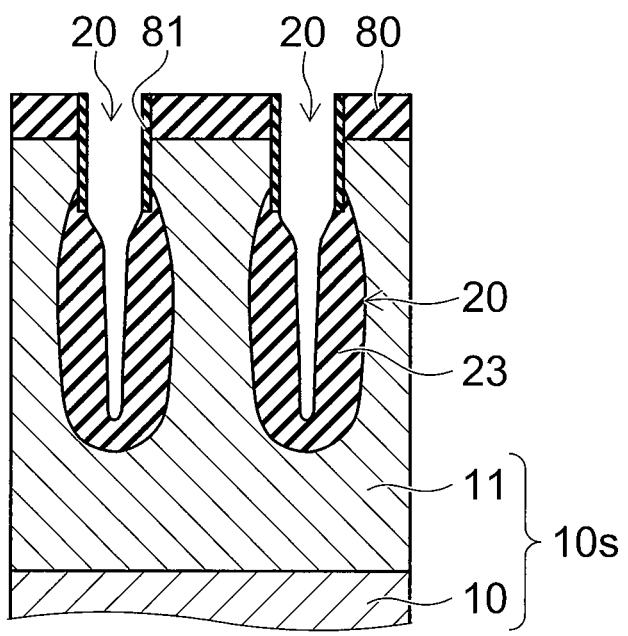

Next, as shown in FIG. 4B, in the inside of the pair of trenches 20, the portion of the surface of the drift layer 11 exposed from the mask film 81 is oxidized. The oxidization of the surface of the drift layer 11 is performed, for example, by LOCOS (Local Oxidation of Silicon) in oxidation atmosphere. As a result, on the surface of the drift layer 11 exposed from the mask film 81, the field plate insulating film 23 is formed.

Figure 5A:
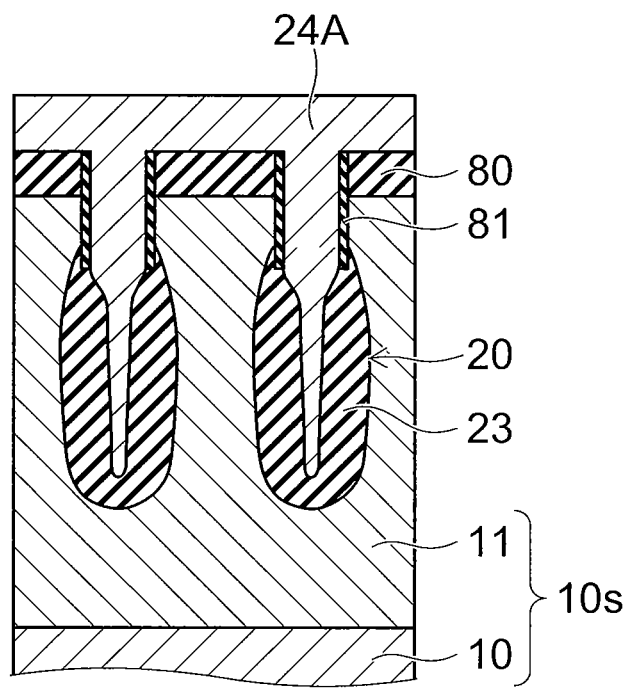

Then, as shown in FIG. 5A, a conductive layer 24A is buried by the CVD (Chemical Vapor Deposition) in each of the pair of trenches 20. The conductive layer 24A is, for example, a polysilicon layer. Subsequently, an etch-back of the conductive layer 24A is performed until the surface of the conductive layer 24A becomes lower than the upper end of the field plate insulating film 23. Afterward, the mask film 81 is removed. This state is shown in FIG. 5B.

Figure 5B:
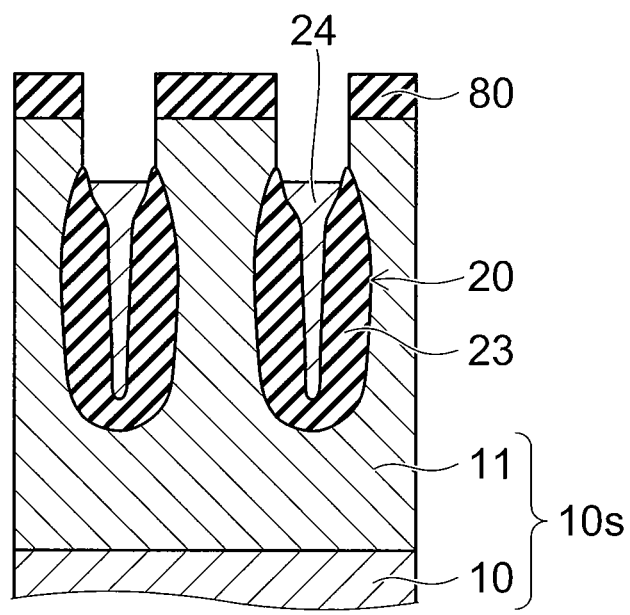

As shown in FIG. 5B, in each of the pair of trenches 20, the field plate electrode 24 is formed via the field plate insulating film 23. Afterward, the mask component 80 is removed.

Figure 6A:
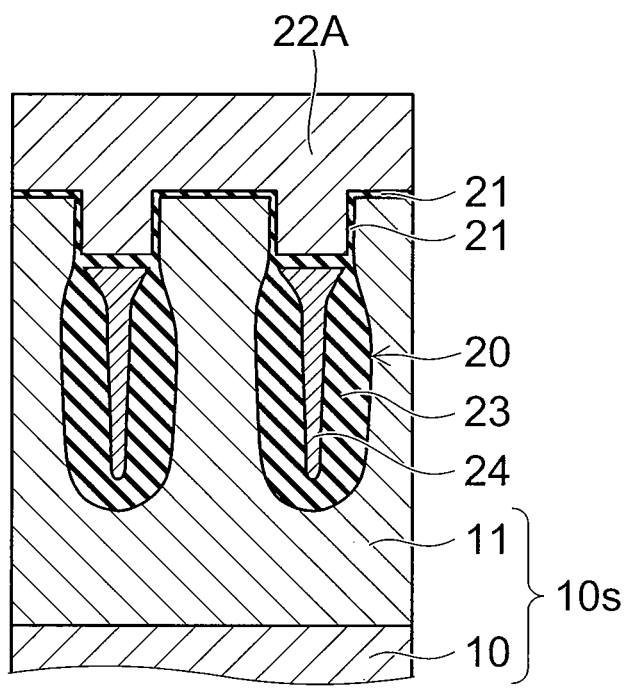

Then, as shown in FIG. 6A, in each of the pair of trenches 20, the gate insulating film 21 is formed on the inner side faces of the trenches 20 and on the field plate electrode 24. The gate insulating film 21 is formed, for example, by thermal oxidation in oxidation atmosphere. Subsequently, the conductive layer 22A is buried in each of the pair of trenches 20 by the CVD. The conductive layer 22A is, for example, a polysilicon layer. Afterward, the conductive layer 24A is etch-backed so that the surface of the conductive layer 24A and the surface of the drift layer 11 are positioned at the same height. This state is shown in FIG. 6B.

Figure 6B:
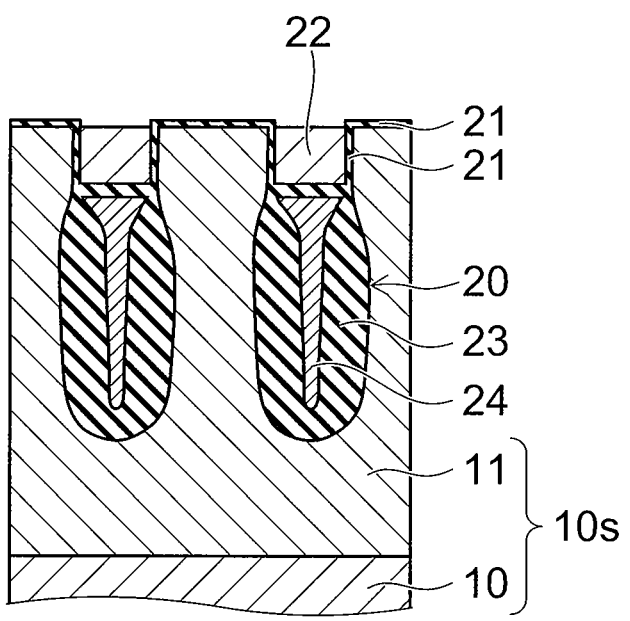

As shown in FIG. 6B, the gate electrode 22 is formed in each of the inside of the pair of trenches 20 via the gate insulating film 21.

When forming the gate electrode 22, and the field plate electrode 24 in each of the pair of trenches 20, the adjustment is performed such that the thickness of a part of the field plate insulating film 23 becomes greater than the thickness of the gate insulating film 21. Furthermore, the adjustment is performed such that the width of the drift layer 11 between the parts of the field plate insulating film 23 provided in each of the pair of the trenches 20 is narrower than the width of the drift layer 11 between the gate insulating films 21 provided in each of the pair of trenches 20.

By carrying out the process to be described later, the drift layer 11 between the gate insulating films 21 provided in each of the pair of trenches 20 is reformed into the base region 12. That is, in the embodiment, it is adjusted such that the width of the drift layer 11 between the parts of the field plate insulating film 23 provided in each of the pair of trenches 20 is narrower than the width of the base region 12 between the gate insulating films 21 provided in each of the pair of trenches 20.

Afterward, the gate insulating film 21 formed on the surface of the drift layer 11 is removed. Subsequently, as shown in FIG. 1, the plurality of base regions 12 are formed on the surface of the drift layer 11 by ion injection. Furthermore, the source region 13 and the contact region 15 are selectively formed on the surface of each of the base regions 12 by ion injection. Moreover, the first major electrode 90 to be electrically connected to the drift layer 11 via the drain layer 10, and the second major electrode 91 to be electrically connected to the source region 13 and the contact region 15 are formed. The semiconductor device 100 is formed by the foregoing manufacturing process.

In the manufacturing process of the semiconductor device according to the first embodiment, like the semiconductor device 100 shown in FIG. 2, the width of the source region 13 may be adjusted such that the source region 13 is not formed directly above the interface between the drift layer 11 and the part of the field plate insulating film 23.

The effect of the semiconductor device 100 will be explained. Before explaining the effect of the semiconductor device 100, a schematic cross-sectional view of a semiconductor device 300 according to a reference example is shown in FIG. 7.

Figure 7:
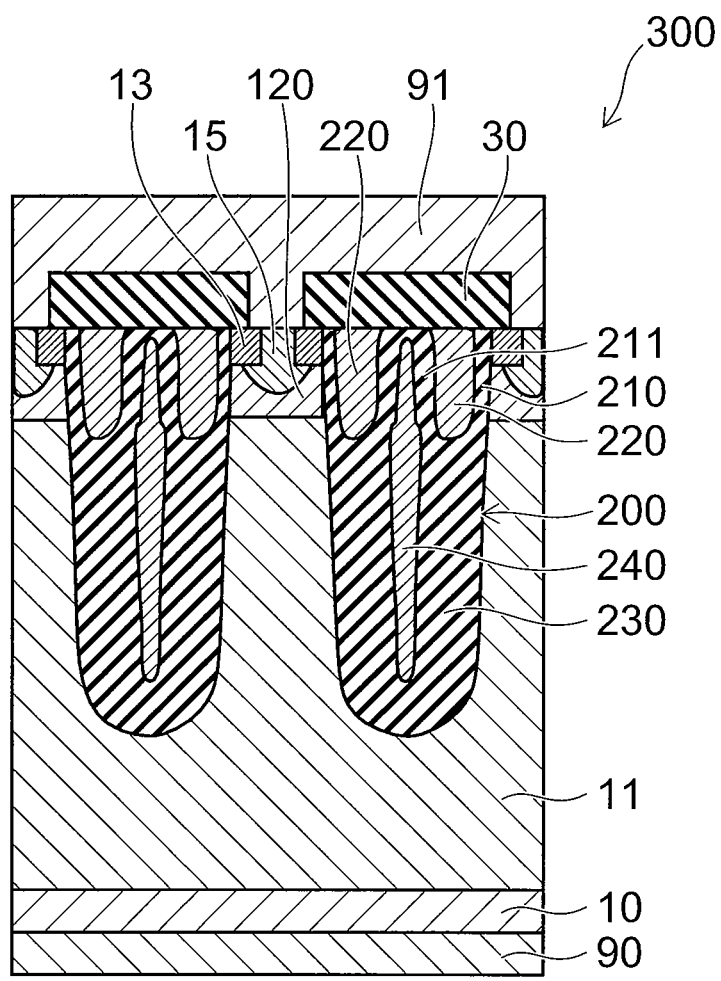
FIG. 7 is a schematic cross-sectional view of a semiconductor device according to a reference example.

In the semiconductor device 300 shown in FIG. 7, the gate electrode 220 and the field plate electrode 240 are provided in each of the pair of trenches 200. The field plate electrode 240 is, for example, electrically connected to the second major electrode 91. The trench 200 is formed in inverted gradual tapered shape (in such shape that the lower the part is, the narrower the trench 200 becomes).

In the semiconductor device 300, the width of the base regions 120 between the pair of trenches 200 is narrower than the width of the drift layer 11 between the pair of trenches 200.

Therefore, when the pitches of the trenches 20 of the semiconductor device 100 according to the first embodiment is the same as the pitches of the trenches 200 of the semiconductor device 300 according to the reference example, the width of the base region 120 between the trenches 200 of the semiconductor device 300 becomes narrower than the width of the base region 12 between the trenches 20 of the semiconductor device 100.

Therefore, in the semiconductor device 300, when forming the source region 13 and the contact region 15 on the surface of the base region 120, the source region 13 and the contact region 15 are to be formed on the surface in the narrow region of the base region 120. Thus, it is difficult to align the source region 13 and the contact region 15.

In the semiconductor device 300, since the trench 200 is formed in inverted tapered shape, the upper is the portion, the wider is the trench 200. Therefore, when forming the necessary components in the trenches 200 adjacent to the base region 120, it is necessary to form the gate electrode 220 rather thick or to have a configuration that the upper portion of the field plate electrode 240 is sandwiched between the gate electrodes 220.

However, in the configuration in which the field plate electrode 240 is sandwiched between the gate electrodes 220, it is necessary that the insulating film 211 be provided between the field plate electrode 240 and the gate electrode 220. Thus, the parasitic capacitance, between the gate electrode 220 and the second major electrode 91, increases.

Figure 8:
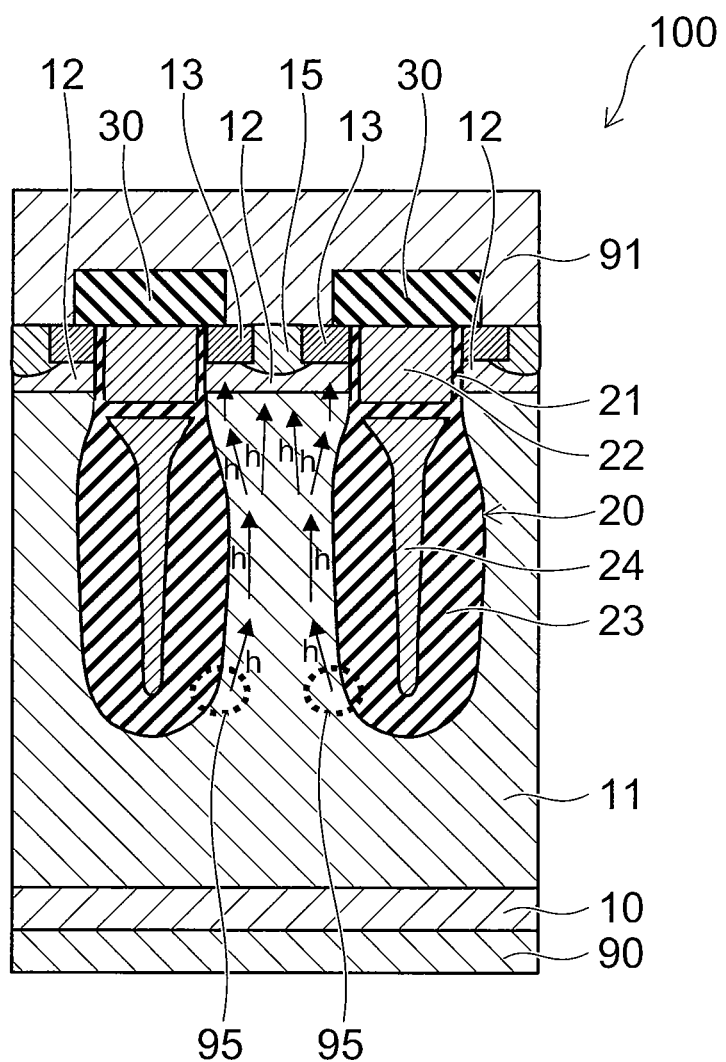
FIG. 8 is a schematic cross-sectional view for explaining an effect of the semiconductor device according to the first embodiment.

In contrast, FIG. 8 is a schematic cross-sectional view for explaining the effect of the semiconductor device according to the first embodiment.

In the semiconductor device 100, the width of the trench 20 at the part of the gate insulating film 21 is narrower than the width of the trench 20 at the part of the field plate insulating film 23. That is, the width of the base region 12 between the pair of trenches 20 is wider than the width of the drift layer 11 between the pair of trenches 20.

Therefore, even if the pitches of the trenches 20 become narrower, it is possible to ensure the base region 12 having the width wider than the width of the drift layer 11. Therefore, it is possible to form the source region 13 and the contact region 15 on the surface in a wider region of the base region 12, which in turn makes it possible to align the source region 13 and the contact region 15 with ease.

Moreover, in the semiconductor device 100, the upper part of the trench 20 is narrower than the lower side. Therefore, in the trench 20 adjacent to the base region 12, it is only necessary to form the gate electrode 22 via the gate insulating film 21. Therefore, the above-described insulating film 211 becomes unnecessary. As a result, it is possible to suppress an increase in parasitic capacitance between the gate electrode 22 and the second major electrode 91.

Moreover, in the semiconductor device 100, even if, for example, a breakdown occurs due to the avalanche breakdown in the lower end portion 95 of the trench 20, and holes h are generated in a vicinity of the lower end portion 95 of the trench 20, the holes h are promptly discharged to the second major electrode 91 via the contact region 15 (see an arrow h in the figure). Particularly, as shown in FIG. 2, in the case where the contact region 15 is formed directly above the interface between the part of the field plate insulating film 23 and the drift layer 11 without forming the source region 13 directly above the interface, the holes h reach the contact region 15 preferentially to the source region 13.

If the holes h do not reach the contact region 15 preferentially, there may be the cases where the holes h remain in the base region 12. Therefore, it is possible that the potential in the base region 12 increases which in turn causes the bipolar action by the parasitic bipolar transistor. When associated with the bipolar action, there is a possibility that the device breakdown occurs by a so-called latch-up.

The semiconductor device 100 has such configuration that the holes h reach the contact region 15 preferentially to the source region 13. As a result, the semiconductor device 100 has high avalanche resistance.

Second Embodiment

Figure 9:
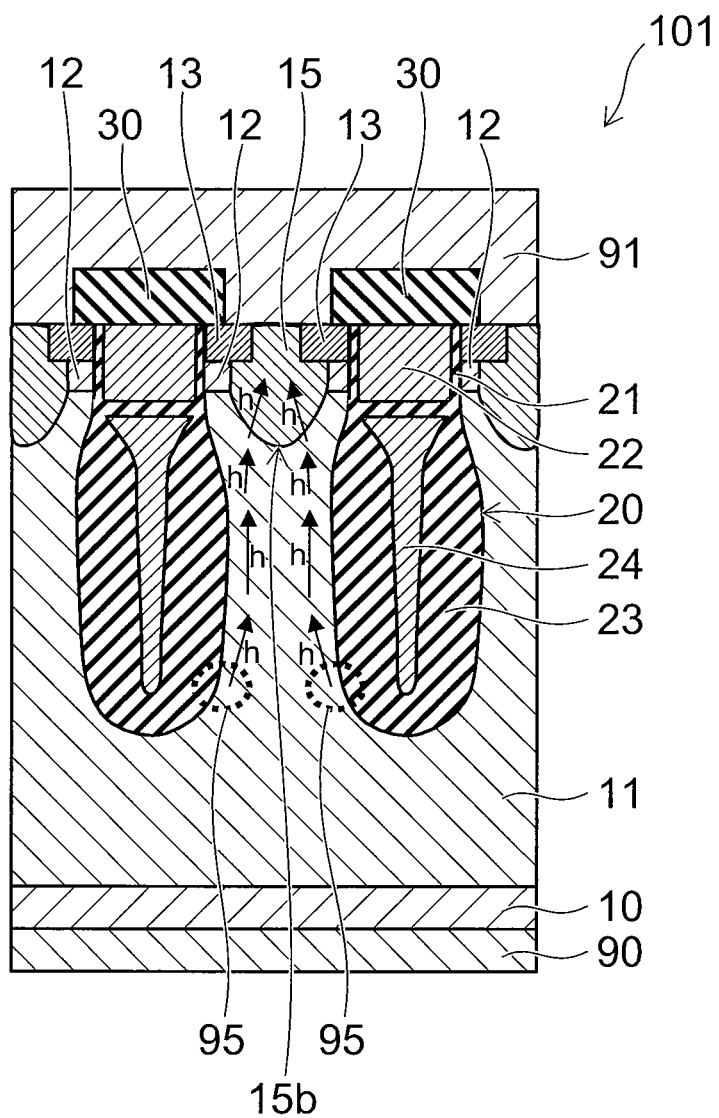
FIG. 9 is a schematic cross-sectional view of a semiconductor device according to a second embodiment.

FIG. 9 is a schematic cross-sectional view of a semiconductor device according to a second embodiment.

The basic configuration of a semiconductor device 101 according to the second embodiment is the same as that of the semiconductor device 100. However, in the semiconductor device 101, the contact region 15 penetrates the base region 12. Furthermore, the lower end 15b of the contact region 15 is in contact with the drift layer 11.

With this configuration, holes h generated in a vicinity of the lower end portion 95 of the trench 20 are more liable to be discharged with ease to the second major electrode 91 via the contact region 15 as compared with the case of the semiconductor device 100. As a result, in the semiconductor device 101, low ON-resistance can be realized. In the meantime, the semiconductor device 101 has still higher avalanche resistance than the semiconductor device 100.

Third Embodiment

Figure 10:
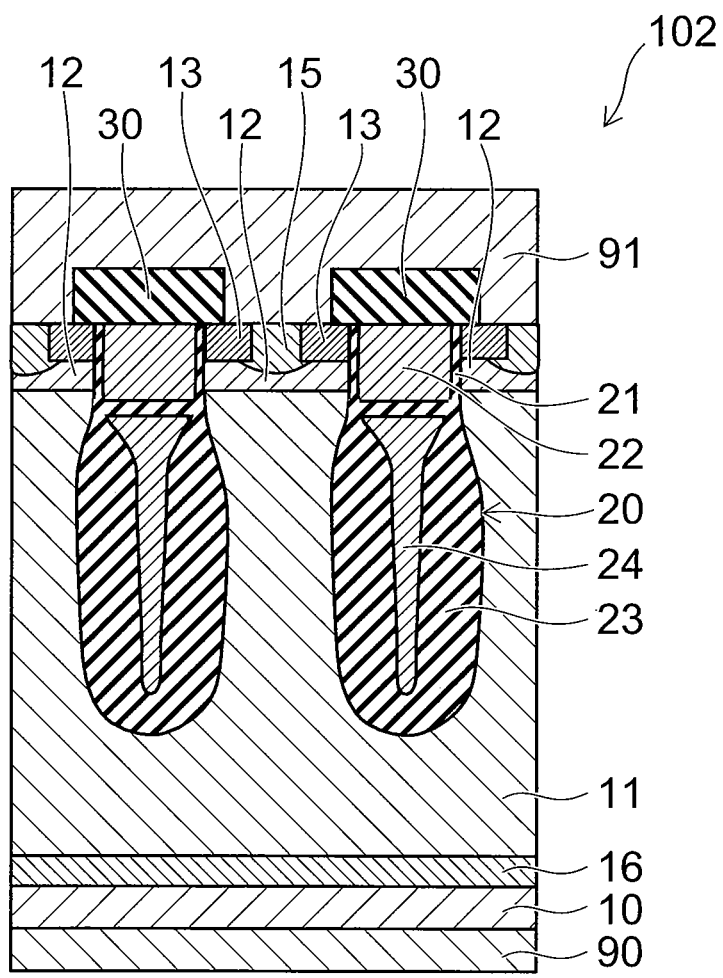
FIG. 10 is a schematic cross-sectional view of a semiconductor device according to a third embodiment.

FIG. 10 is a schematic cross-sectional view of a semiconductor device according to a third embodiment.

A semiconductor device 102 according to the third embodiment is an IGBT (Insulated Gate Bipolar Transistor) device. That is, in the semiconductor device 102, a P$^+$-type semiconductor layer (second semiconductor layer) 16 is provided between the drift layer 11 and the first major electrode 90 in addition to the configuration of the semiconductor device 100. The p$^+$-type semiconductor layer 16 is provided on the drain layer 10. When operating the semiconductor device 102, holes are injected from the p-type semiconductor layer 16. As a result, the semiconductor device 102 exhibits effect similar to the effect exhibited by the semiconductor device 100. Furthermore, in the semiconductor device 102, it is possible to flow larger current than that of the semiconductor device 100.

Fourth Embodiment

Figure 11:
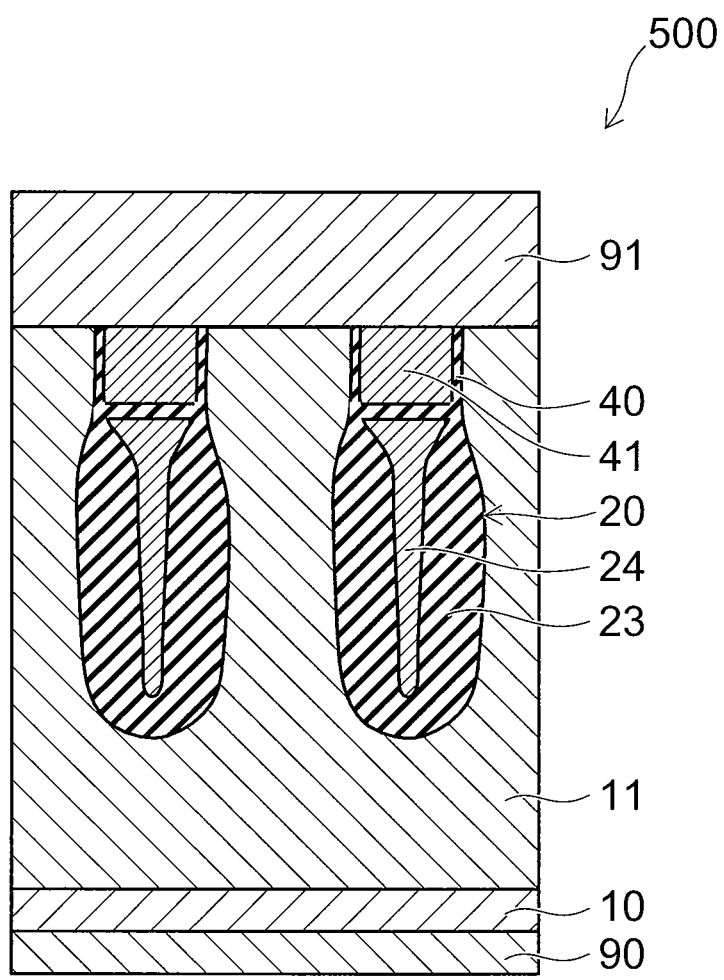
FIG. 11 is a schematic cross-sectional view of a semiconductor device according to a fourth embodiment.

FIG. 11 is a schematic cross-sectional view of a semiconductor device according to a fourth embodiment.

The semiconductor device 500 according to the fourth embodiment is an SBD. In the semiconductor device 500, the n-type drift layer 11 is provided on the n$^+$-type drain layer 10. Since the semiconductor device 500 is the SBD, the drain layer 10 and the drift layer 11 may be generally referred as the n-type semiconductor layers.

The pair of trenches 20 are provided from the surface to the inside of the drift layer 11. In the inside of each of the trenches 20, a conductive layer 41 is provided. An insulating film 40 is provided between the conductive layer 41 and the drift layer 11.

In the pair of trenches 20, each of the field plate electrodes 24 is provided under the conductive layers 41 via the field plate insulating films 23. The thickness of a part of the field plate insulating film 23 is greater than the thickness of the insulating film 40. The width of the drift layer 11 between the parts of the field plate insulating films 23 provided in each of the pair of trenches 20 is narrower than the width of the drift layer 11 between the conductive layers 41 provided in each of the pair of trenches 20. In other words, the width of the drift layer 11 between the pair of trenches 20 at the position of the part of the field plate insulating film 23 is narrower than the width of the drift layer 11 between the pair of trenches 20 at the position of the conductive layer.

On the rear surface side of the drift layer 11, the first major electrode, i.e., the cathode electrode is electrically connected to the drift layer 11 via the drain layer 10. On the surface side of the drift layer 11, the second major electrode 91, i.e., the anode electrode, is electrically connected to the drift layer 11 and the conductive layer 41. The second major electrode 91 and the drift layer 11 form a Schottky barrier junction.

In the semiconductor device 500, the width of the drift layer 11 between the parts of the field plate insulating films 23 provided in each of the pair of trenches 20 is narrower than the width of the drift layer 11 between the conductive layers 41 provided in each of the pair of trenches 20. With this structure, an area of the Schottky barrier junction increases. As a result, a forward voltage drop (VF) of the SBD is reduced.

Moreover, in the semiconductor 500, the field plate electrode 24 in trench shape is provided in the drift layer 11. Therefore, the drift layer 11 is liable to be depleted with ease. As a result, the impurity concentration in the drift layer 11 can be made high. As a result, the specific resistance of the drift layer 11 is reduced, and the forward voltage drop (VF) is furthermore reduced.

Moreover, in the semiconductor device 500, the conductive layer 41 is provided on the field plate electrode 24 via the insulating film 40 in the trench 20. In the state where reverse-direction voltage (VR) is applied to the semiconductor device 500, an empty layer expands from the second major electrode 91 to the drift layer 11 and expands also from the insulating film 40 to the drift layer 11. As a result, in the semiconductor 500, even if the inverse-direction voltage is applied to the semiconductor device 500 at the reverse recovery of the semiconductor device 500, it is possible to suppress leakage current (IR) to be low.

Moreover, in the semiconductor device 500, the impurity concentration in the drift layer 11 between the conductive layers 41 provided in each of the pair of the trenches 20 may be set to be lower than the impurity concentration in the drift layer 11 between the parts of the field plate insulating film 23 provided in each of the pair of trenches 20. As a result, the drift layer 11 between the parts of the field plate insulating films 23 can be made more liable to be depleted than the drift layer 11 between the conductive layers 41. As a result, it is possible to further suppress the leakage current.

Additionally, the semiconductor device 500 and each of the SBDs to be illustrated below may be provided on the same semiconductor substrate 10s as each of the semiconductor devices 100 to 102. For example, in the manufacturing process of the semiconductor device 500, after carrying out the processes shown in FIGS. 3A to 6B, the gate insulating film 21 shown in FIG. 6B is removed from the surface of the drift layer 11, to form the first major electrode 90 and second major electrode 91. Here, the thickness of a part of field plate insulating film 23 is adjusted to be greater than the thickness of the insulating film 40. Moreover, the width of the drift layer 11 between the parts of the field plate insulating films 23 provided in each of the pair of trenches 20 is adjusted to be narrower than the width of the drift layer 11 between the insulating films 40 provided in each of the pair of trenches 20.

Fifth Embodiment

Figure 12:
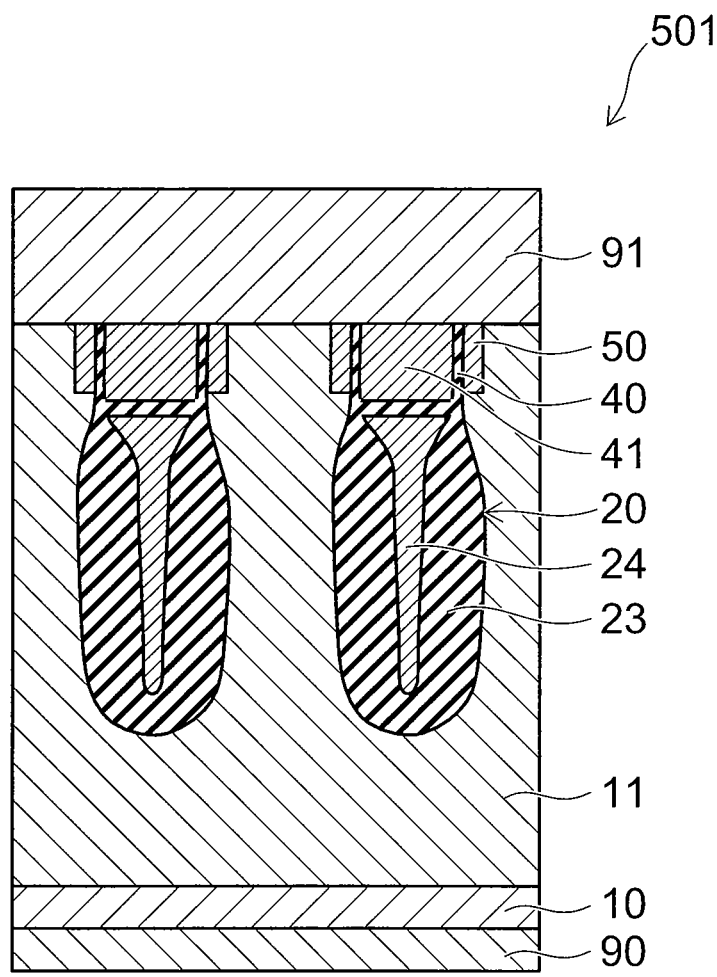
FIG. 12 is a schematic cross-sectional view of a semiconductor device according to a fifth embodiment.

FIG. 12 is a schematic cross-sectional view of a semiconductor device according to a fifth embodiment.

The basic configuration of the semiconductor device 501 according to the fifth embodiment is the same as that of the semiconductor device 500. However, in the semiconductor device 501 according to the fifth embodiment, a p-type semiconductor layer 50 (a third semiconductor layer) is further provided on the surface of the drift layer 11 having the insulating film 40 in between. The p-type semiconductor layer 50 is connected to the second major electrode 91.

In the semiconductor device 501, a pn junction is formed by the p-type semiconductor layer 50 and the drift layer 11. Therefore, the empty layer expands also from the p-type semiconductor layer 50 to the drift layer 11. As a result, when an inverse-direction voltage is applied to the semiconductor device 501, the portion of the drift layer 11 sandwiched between the conductive layers 41 becomes more liable to be depleted as compared with the case of the semiconductor device 500. As a result, even if the inverse-direction voltage is applied to the semiconductor device 501 at the reverse recovery of the semiconductor device 501, it is possible to further suppress the leakage current (IR) as compared with the semiconductor device 500.

The p-type semiconductor layer 50 is formed in the following manner. That is, after carrying out the processes shown in FIGS. 3A to 6B, the p-type semiconductor layer 50 is formed on the surface of the drift layer 11 to be adjacent to the insulating film 40.

Specifically, the p-type semiconductor layer 50 may be formed, for example, by any one of the following methods (1) to (3):

(1) A method in which after selectively forming a mask component, in which openings are formed at portions where the p-type semiconductor layer 50 is to be formed, on the drift layer by Photolithography, boron (B) is injected by ion injection into the surface of the drift layer 11, which is open from the mask component;

(2) A method in which after forming the SOG (Spin On Glass) film so as to selectively contain boron (B) on the drift layer 11, the heat treatment is applied to the SOG film, and the boron (B) included in the SOG film is diffused in the drift layer 11 (a major component of the SOG film is silicon oxide (SiOx)); and (3) After selectively forming a polysilicon layer containing boron (B) on the drift layer 11, a thermal process of the polysilicon layer is performed so as to diffuse the boron included in the polysilicon layer.

The p-type semiconductor layer 50 shown below is also formed in the similar processes.

Sixth Embodiment

Figure 13:
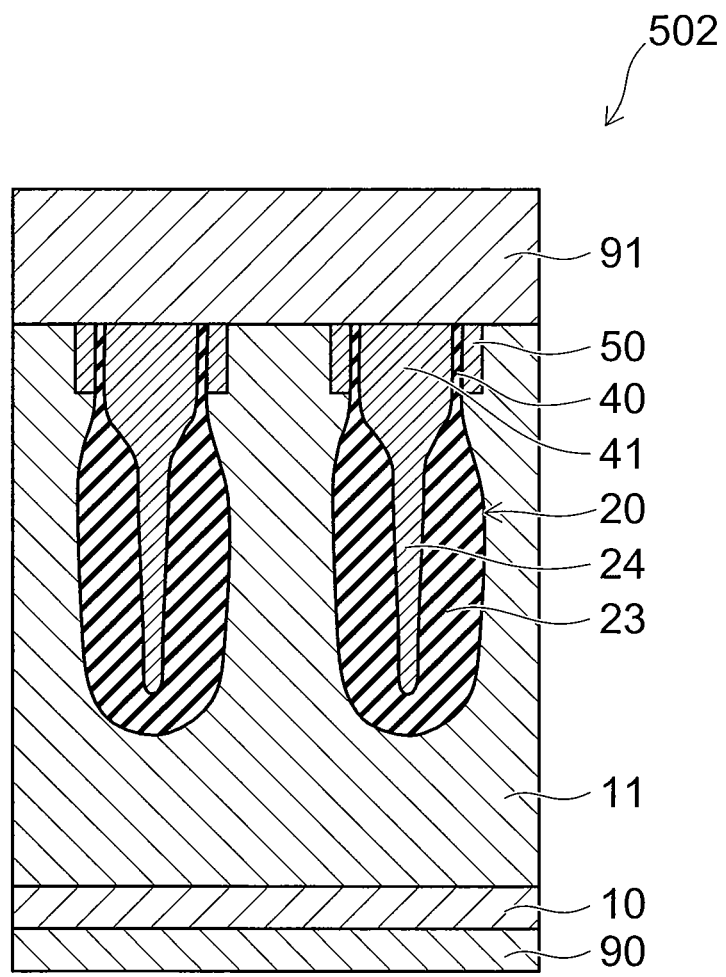
FIG. 13 is a schematic cross-sectional view of a semiconductor device according to a sixth embodiment.

FIG. 13 is a schematic cross-sectional view of a semiconductor device according to a sixth embodiment.

In a semiconductor device 502 according to the sixth embodiment, the conductive layer 41 and the field plate electrode 24 are connected. With this configuration, it is not necessary that the conductive layer 41 and the field plate electrode 24 be formed separately. That is, since the conductive layer 41 and the field plate electrode 24 can be formed at the same time, the manufacturing process can be simplified.

As a result, it is possible to suppress the manufacturing cost of the semiconductor device 502 to be low.

Seventh Embodiment

Figure 14:
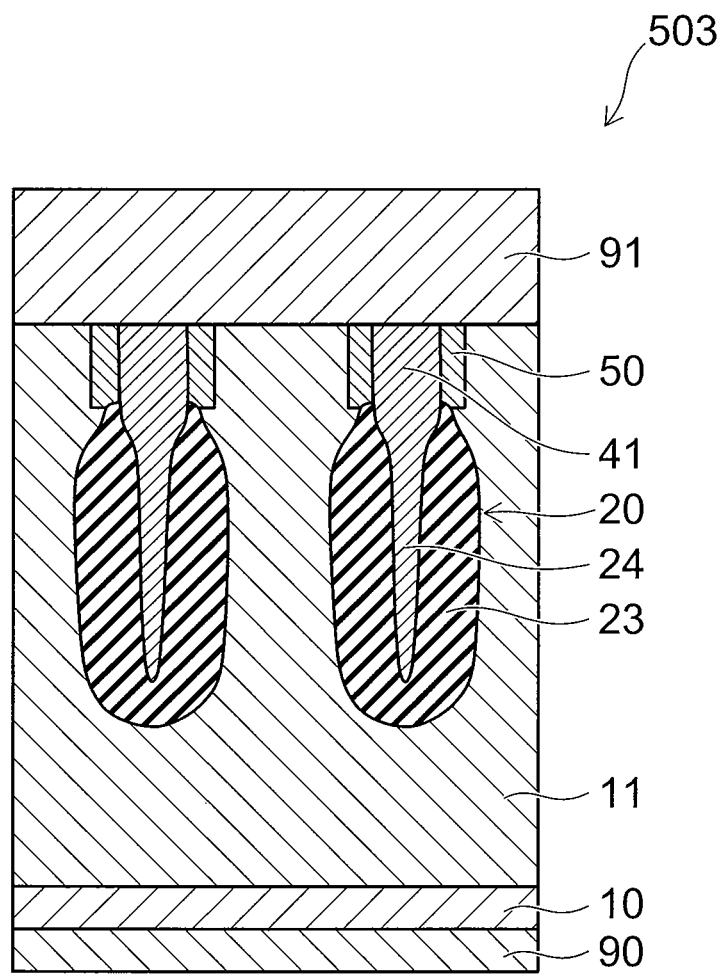
FIG. 14 is a schematic cross-sectional view of a semiconductor device according to a seventh embodiment.

FIG. 14 is a schematic cross-sectional view of a semiconductor device according to a seventh embodiment.

In a semiconductor device 503 according to the seventh embodiment, the insulating film 40 provided in the semiconductor device 500 is removed. In the semiconductor device 503, a p-type semiconductor layer 50 is provided to the surface of the drift layer 11. The p-type semiconductor layer 50 is connected to the conductive layer 41 and the second major electrode 91.

The procedure for forming the p-type semiconductor layer 50 is as follows. For example, for the material of the conductive layer 41, polysilicon containing boron (B) is adopted. After forming the semiconductor layer, i.e., a precursor layer of the p-type semiconductor layer 50 in the conductive layer 41, boron is diffused into the precursor layer, thereby forming the p-type semiconductor layer 50.

In the case of the semiconductor device 503, the manufacturing process can be simplified to an extent that the insulating film is not formed. As a result, it is possible to further reduce the manufacturing cost of the semiconductor device 503. Furthermore, in the case of the semiconductor device 503, the potential of the conductive layer 41 is directly conveyed to the p-type semiconductor layer 50 to an extent that the insulating film 40 is not formed. That is, to an extent that the electric charges are not charged to the insulating film 40, the potential in the conductive layer 41 can be efficiently conveyed to the p-type semiconductor layer 50. Therefore, even if the inverse-direction voltage is applied to the semiconductor device 503 at the reverse recovery of the semiconductor device 503, it is possible to suppress leakage current (IR) to be still lower than the case of the semiconductor device 501.

Eighth Embodiment

Figure 15:
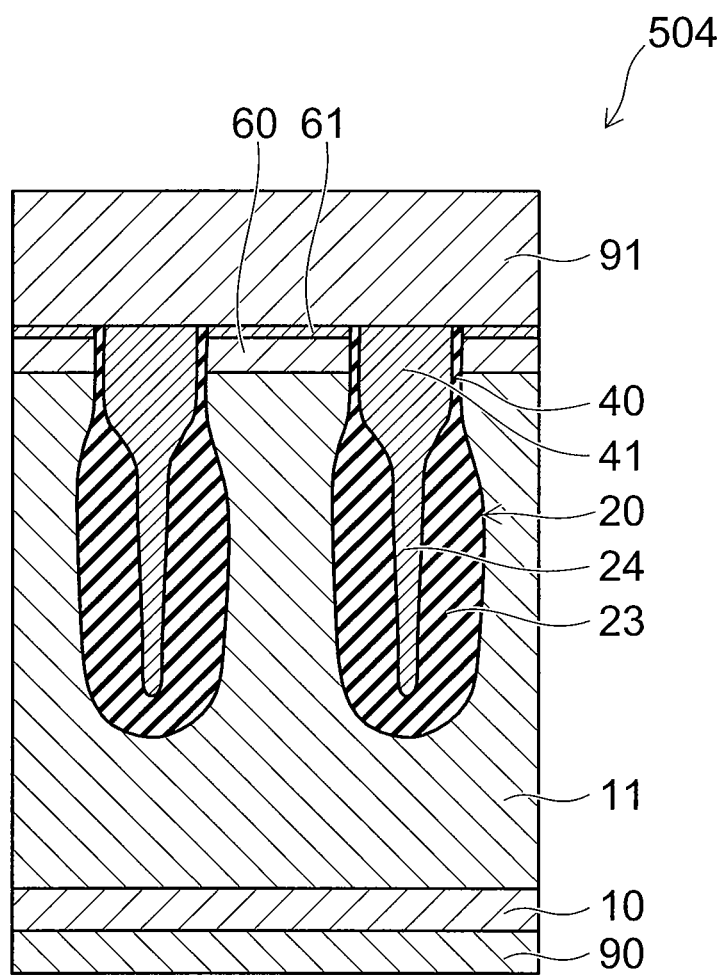
FIG. 15 is a schematic cross-sectional view of a semiconductor device according to an eighth embodiment.

FIG. 15 is a schematic cross-sectional view of a semiconductor device according to an eighth embodiment.

A semiconductor device 504 according to the eighth Embodiment is a high speed high efficiency diode (High Efficiency Diode, HED). In the semiconductor device 504, a p-type semiconductor layer 60 (a fourth semiconductor layer) is furthermore provided between the drift layer 11 and the second major electrode 91. Another p-type semiconductor layer 61 (a fifth semiconductor layer) is interposed between the p-type semiconductor layer 60 and the second major electrode 91.

For example, the impurity concentration in the p-type semiconductor layer 60 is lower than the impurity concentration in the above-mentioned p-type semiconductor layer 50. The impurity concentration in the p-type semiconductor layer 60 is, for example, $1 \times 10^{17}$ to $1 \times 10^{18}$ (atoms/cm$^3$). The impurity concentration in the p-type semiconductor layer 61 is higher than the impurity concentration in p-type semiconductor layer 50. The impurity concentration in the p-type semiconductor layer 61 is, for example, not less than $1 \times 10^{19}$ (atoms/cm$^3$). The p-type semiconductor layer 61 may be referred to as a high density p-type semiconductor layer or an ohmic layer. The p-type semiconductor layer 61 and the second major electrode 91 are in ohmic contact with one another.

Since the p-type semiconductor layer 61 is a high density p-type semiconductor layer, an amount of the hole injection increases, and there is a possibility that reverse recovery time (Trr) of the semiconductor device becomes longer. In response, in the embodiment, the p-type semiconductor layer 61 is formed thin so as to suppress the hole injection while maintaining the ohmic contact. Moreover, the p-type semiconductor layer 60 is formed to such thickness that the empty layer extends to increase the withstand voltage of the semiconductor device. The p-type semiconductor layer 60 is formed to have a concentration lower than the p-type semiconductor layer 61 to reduce an amount of hole injection.

Additionally, since the p-type semiconductor layer 60 is not a high density p-type semiconductor layer, an amount of the hole injection becomes small. Therefore, it may be considered that the conductivity of the drift layer 11 is reduced, which in turn increases the forward voltage drop (VF). However, in the semiconductor device 504, since the field plate electrode 24 is provided, the concentration in the drift layer 11 can be increased. As a result, it is possible to suppress an increase in forward voltage drop (VF).

Other than the foregoing, the semiconductor device 504 may be arranged such that a lifetime killer layer is formed in at least a part of at least either one of the p-type semiconductor layer 60 and the drift layer 11. For example, platinum (Pt), gold (Au), or the like may be diffused in at least the part of at least either one of the p-type semiconductor layer 60 and the drift layer 11. Alternatively, electron beam and proton may be projected to at least the part of at least either one of the p-type semiconductor layer 60 and the drift layer 11. By providing the lifetime killer layer, it is possible to still reduce the life of the holes injected from the p-type semiconductor layer 61 to the drift layer 11. As a result, in the semiconductor device 504, an increase in reverse recovery time (Trr) can be suppressed.

Moreover, in the semiconductor device 504, in order to reduce the contact resistance between the second major electrode 91 and the p-type semiconductor 61, an aluminum (Al) film, an aluminum silicon (AlSi) film or the like to which a heat treatment has been applied may be used as a material for the second major electrode 91.

By the heat treatment, aluminum atoms are diffused from the second major electrode 91 to the inside of the silicon semiconductor layer. As a result, a width of the first semiconductor layer between parts of the field plate insulating films provided in each of the pair of trenches is narrower than a width of the first semiconductor layer between the insulating films provided in each of the pair of trenches. the semiconductor layer in contact with the second major electrode 91 ohmic functions as the p-type semiconductor layer with respect to the second major electrode 91 in the same manner as the semiconductor layer in which Boron (B) is diffused.

Hereinabove, exemplary embodiments of the invention are described with reference to specific examples. However, the invention is not limited to these specific examples. More specifically, one skilled in the art can suitably modify these examples, and such modifications are also encompassed within the scope of the invention as long as they have the characteristics of the embodiments. For instance, the layout, material, condition, shape, size and the like of the components included in the above examples are not limited to those illustrated, but can be suitably modified.

Additionally, each component provided in each of the above-described embodiments can be suitably combined wherever possible technically, and such combinations are also encompassed within the scope of the embodiments as long as they have the characteristics of the embodiments. Other than the foregoing, within the technical scope of the embodiments, it is to be understood by one skilled in the art, various modified examples and corrected examples can be conceived, and such modified examples and corrected examples also are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor transistor device, comprising:
a first semiconductor layer of a first conductivity type;
a plurality of base regions of a second conductivity type, the base regions provided on a surface of the first semiconductor layer;
a source region of the first conductivity type selectively provided on each of surfaces of the base regions;
a first major electrode electrically connected to the first semiconductor layer;
a second major electrode electrically connected to the source region;
a gate electrode provided via a gate insulating film in each of a pair of trenches on a side of the second major electrode, each of the trenches reaching from a surface of the source region to the first semiconductor layer; and
a field plate electrode provided via a field plate insulating film in each of the pair of trenches on a side of the first major electrode,
a thickness of a part of the field plate insulating film being greater than a thickness of the gate insulating film,
an interface between the first semiconductor layer and the part of the field plate insulating film, not being provided between the source region and the first major electrode, and being provided between the base region and the first major electrode in a direction in which each of the pair of trenches are aligned,
a width of the first semiconductor layer between the pair of trenches at a position of a part of the field plate insulating film being narrower than a width of each of the base regions between the pair of trenches at a position of the gate insulating film, and
the source region not being formed directly above the interface between the first semiconductor layer and the part of the field plate insulating film.

2. The device according to claim 1, wherein:
a contact region of the second conductivity type is further provided selectively on a surface of the base region;
the contact region is connected to the source region; and
an impurity concentration in the contact region is higher than an impurity concentration in the base region.

3. The device according to claim 2, wherein a distance between a lower end of the contact region and a rear surface of the first semiconductor layer is shorter than a distance between a lower end of the source region and the rear surface of the first semiconductor layer.

4. The device according to claim 2 wherein the contact region penetrates the base region and the lower end of the contact region is in contact with the first semiconductor layer.

5. The device according to claim 2, wherein the contact region is formed directly above the interface between the first semiconductor layer and the part of the field plate insulating film.

6. The device according to claim 1, wherein a second semiconductor layer of the second conductivity type is further provided between the first semiconductor layer and the first major electrode.

7. A semiconductor transistor device, comprising:
a first semiconductor layer of a first conductivity type;
a plurality of base regions of a second conductivity type provided on a surface of the first semiconductor layer;
a source region of the first conductivity type provided on a first portion of the surface of each of the base regions;
a first major electrode electrically connected to the first semiconductor layer;
a second major electrode electrically connected to the source region;
a gate electrode provided via a gate insulating film in each of a pair of trenches that extend from a surface of the source region into the first semiconductor layer; and
a field plate electrode provided via a field plate insulating film in each of trenches, wherein
a thickness of the field plate insulating film is greater than a thickness of the gate insulating film, and
no part of the source region lies directly above a portion of the first semiconductor layer between the pair of trenches that has the narrowest width.

8. The semiconductor transistor device of claim 7, further comprising:
a contact region of the second conductivity type provided on a second portion of the surface of each of the base regions, wherein
an impurity concentration in the contact region is higher than an impurity concentration in the base region.

9. The semiconductor transistor device of claim 8, wherein the first portion and the second portion are adjacent.

10. The semiconductor transistor device of claim 9, wherein a boundary between the first portion and the second portion lies directly above a portion of the field plate insulating film.

* * * * *